(12) United States Patent
Moriyama

(10) Patent No.: US 6,195,260 B1
(45) Date of Patent: Feb. 27, 2001

(54) FLEXIBLE PRINTED CIRCUIT BOARD UNIT HAVING ELECTRONIC PARTS MOUNTED THEREON

(75) Inventor: Yoshifumi Moriyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/199,228

(22) Filed: Nov. 24, 1998

(30) Foreign Application Priority Data

Nov. 27, 1997 (JP) ..................................................... 9-326224

(51) Int. Cl.$^7$ .............................. H05K 1/00; H05K 1/18; H05K 3/28
(52) U.S. Cl. .......................... 361/749; 361/792; 361/807; 174/254; 257/669
(58) Field of Search .................................... 361/748, 749, 361/750, 751, 795, 792, 807–810; 174/254, 255; 257/687, 669

(56) References Cited

FOREIGN PATENT DOCUMENTS

| | | |
|---|---|---|
| 56-62387 | 5/1981 | (JP) . |
| 57-57575 | 4/1982 | (JP) . |
| 57-146347 | 9/1982 | (JP) . |
| 63-67278 | 5/1988 | (JP) . |
| 1-303781 | 12/1989 | (JP) . |
| 228342 | 1/1990 | (JP) . |
| 3-123040 | * 5/1991 | (JP) . |
| 3220736 | 9/1991 | (JP) . |
| 4-214654 | 8/1992 | (JP) . |
| 4-251968 | 9/1992 | (JP) . |
| 5-267561 | 10/1993 | (JP) . |
| 6-326151 | 11/1994 | (JP) . |
| 8-279576 | 10/1996 | (JP) . |
| 10-154862 | 6/1998 | (JP) . |

OTHER PUBLICATIONS

Yoshio Iinuma; Citizen Watch Co., Ltd., Technical Laboratory; *IC Packaging Technology for Electronic Watch*; pp. 41–44 (No Date).

* cited by examiner

*Primary Examiner*—Jayprakash N. Gandhi
(74) *Attorney, Agent, or Firm*—Ostrolenk, Faber, Gerb & Soffen, LLP

(57) ABSTRACT

A flexible printed circuit unit includes a flexible printed circuit board having one or more electronic parts mounted on a front surface thereof. A reverse side reinforcing plate is provided at a location of the reverse side of the flexible printed circuit board corresponding to a region in which the electronic parts are mounted. An upper reinforcing structure is provided on the front surface of the flexible printed circuit board for covering at least one of the electronic parts.

6 Claims, 3 Drawing Sheets

FLEXIBLE PRINTED CIRCUIT BOARD UNIT HAVING ELECTRONIC PARTS MOUNTED THEREON

BACKGROUND OF THE INVENTION

1. Field of the Invention

This invention relates to a flexible printed circuit board unit wherein electronic parts such as semiconductor devices are mounted on a flexible printed circuit board.

2. Description of the Related Art

A conventional circuit board unit of the type mentioned is disclosed in Japanese Patent Laid-Open No. 220736/1991 which has a structure shown in FIG. 1.

This circuit board unit 101 includes reinforcing plates 109 provided on the reverse side of flexible printed circuit board 102 on which semiconductor devices 106 are mounted. Reinforcing plates 109 are provided particularly on the reverse side of flexible printed circuit board 102 at locations at which semiconductor devices 106 are mounted in order to increase the rigidity of the portions of flexible printed circuit board 102 at the locations at which semiconductor devices 106 are mounted, thereby enhancing the reliability of electric connection between semiconductor devices 106 and flexible printed circuit board 102. Semiconductor devices 106 are encapsulated in encapsulating resin 108.

Japanese Patent Laid-Open No. 220736/1991 mentioned above further discloses circuit board unit 111 wherein, on a front surface of flexible printed circuit board 112 on which semiconductor devices 116 are mounted, reinforcing frames 119 which surround regions in which semiconductor devices 116 are mounted are provided as shown in FIG. 2. In the example shown, encapsulating resin 118 is flowed into and hardened in regions surrounded by reinforcing frames 119 to provide a rigidity to the portions of flexible printed circuit board 112 at which semiconductor devices 116 are mounted and simultaneously encapsulate semiconductor devices 116.

However, the conventional circuit board units described above do not sometimes present a sufficient reinforcing function to enhance the reliability of electric connection between the semiconductor devices and the flexible printed circuit board.

When an assembling process for a circuit board unit is taken into consideration, an organic material such as a glass epoxy material is preferably used for reinforcing members for a flexible printed circuit board. However, organic materials do not provide a sufficient rigidity. If an organic material of a comparatively great thickness is used to assure a sufficient rigidity, then a great difference in thickness will be produced between a location of the flexible printed circuit board at which the reinforcing member is provided and another location at which the reinforcing member is not provided. This makes handling of the flexible printed circuit board in the assembling process difficult. Thus, it may be proposed to alternatively use, for the reinforcing member, a metal plate having a sufficient rigidity with a comparatively small thickness. In this instance, however, since the metal plate is heavier than an organic material, it is difficult to transport the circuit board unit in the assembling process. Further, since the metal plate has a high thermal conductivity, condition setting such as temperature setting when a semiconductor device is to be connected to the flexible printed circuit board becomes severe.

In short, if it is tried to assure a high rigidity of a flexible printed circuit board in order to stabilize the electric connection between semiconductor devices and the flexible printed circuit board, then such disadvantages as described above occur in the assembling process.

SUMMARY OF THE INVENTION

It is an object of the present invention to provide a flexible printed circuit board unit which is easy to handle in its assembling process while assuring a sufficiently high rigidity for a portion of a flexible printed circuit board at which a semiconductor device is mounted.

A flexible printed circuit board unit according to the present invention includes one or more electronic parts mounted on a front surface of a flexible printed circuit board. Further, a reverse side reinforcing plate is provided on a reverse side of the flexible printed circuit board in a region in which the electronic parts are mounted, and an upper reinforcing structure is provided on the flexible printed circuit board in such a manner as to cover at least one of the electronic parts.

In the flexible printed circuit board unit according to the present invention constructed above, the reverse side reinforcing plate provides a rigidity to the region of the flexible printed circuit board in which the electronic parts are mounted. Besides, since the electronic parts mounted on the flexible printed circuit board are covered with the upper reinforcing structure, the rigidity of the flexible printed circuit board after the electronic parts are mounted is provided by the reverse side reinforcing plate and the upper reinforcing structure, and the electronic parts themselves are protected by the upper reinforcing plate. Accordingly, since it is required to take into consideration only the rigidity of the flexible printed circuit board upon mounting of the electronic parts, the reverse side reinforcing plate need not be provided with an unnecessarily great thickness and need not be made of a metal. Consequently, handling of the flexible printed circuit board during mounting of the electronic parts onto the flexible printed circuit board and mounting of the electronic parts are facilitated.

According to a preferred embodiment of the present invention, the flexible printed circuit board includes a film-like base member made of an organic material, and a conductor layer formed on the base member and electrically connected to the electronic parts. In this instance, the reverse side reinforcing plate is preferably made from the same material as that of the base member of the circuit board in order to suppress warpage or deflection of the flexible printed circuit board.

Further, the flexible printed circuit board unit may be constructed such that the electronic parts are semiconductor devices, and the upper reinforcing structure includes an encapsulating resin for encapsulating the semiconductor devices and an upper reinforcing plate provided on the semiconductor devices with the reinforcing resin interposed therebetween. In this instance, it is preferable that the upper reinforcing plate has a recess or recesses formed therein for accommodating the semiconductor devices and the upper reinforcing plate is securely mounted on the flexible printed circuit board by the encapsulating resin in a condition wherein the semiconductor devices are positioned in the recess or recesses in order to protect the semiconductor devices mounted on the flexible printed circuit board. Further, it is preferable that the upper reinforcing plate is made of a metal in order to radiate heat generated by operation of the semiconductor devices efficiently.

The above and other objects, features and advantages of the present invention will become apparent from the following description with reference to the accompanying drawings which illustrate examples of the present invention.

DESCRIPTION OF THE PREFERRED EMBODIMENTS

First Embodiment

Figure 1:
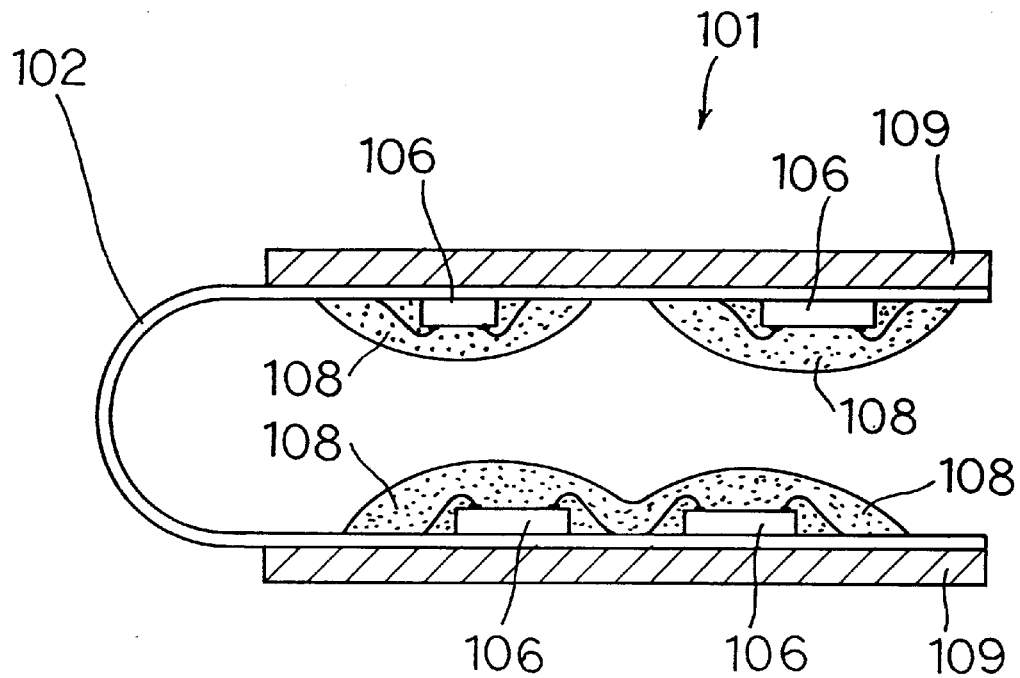
FIG. 1 is a sectional view of an example of a conventional flexible circuit board unit.
Figure 2:
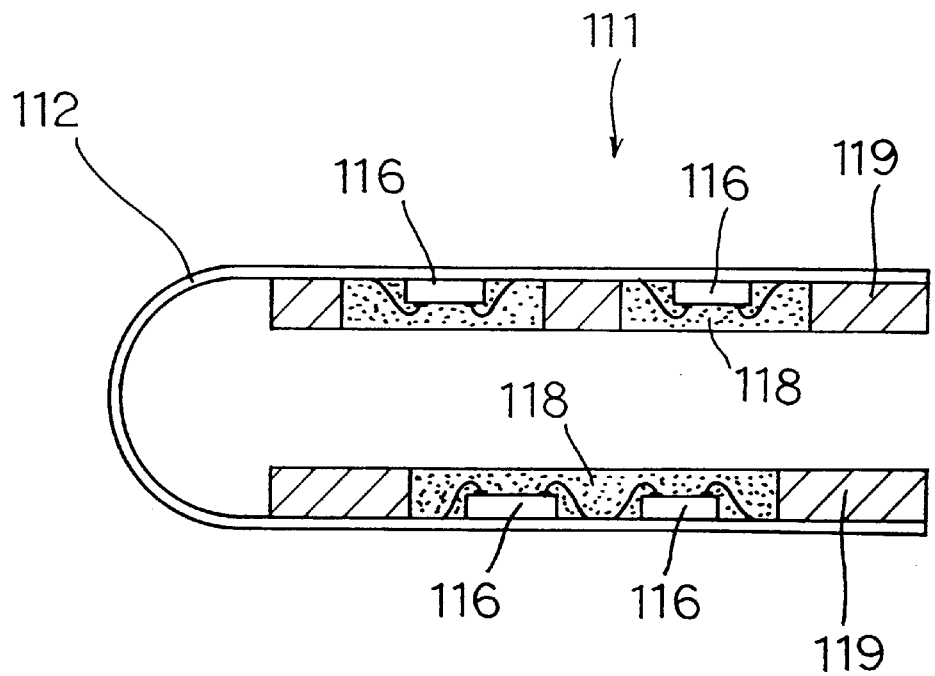
FIG. 2 is a sectional view of another example of a conventional flexible circuit board unit.
Figure 3:
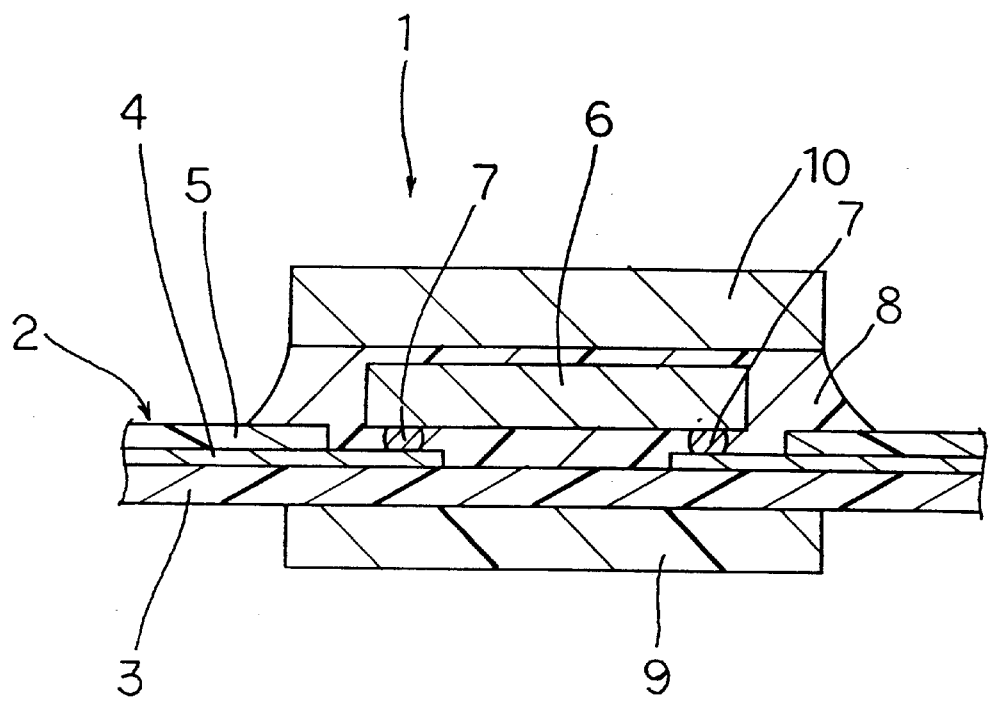
FIG. 3 is a sectional view of part of a flexible printed circuit board unit of a first embodiment of the present invention.

Referring now to FIG. 3, there is shown a circuit board unit 1 according to the first embodiment wherein a semiconductor device 6 is mounted on a flexible printed circuit board 2 with bump electrodes 7 interposed therebetween.

The flexible printed circuit board 2 includes a base film 3 serving as a base member, a conductor layer 4 on the base film 3, and a cover lay 5 on the conductor layer 4. The base film 3, the conductor layer 4 and the cover lay 5 are joined together by a bonding agent (not shown). The base film 3 may be usually made of polyimide. While the conductor layer 4 is formed as a single layer in the example shown in FIG. 3, a plurality of layers may be provided. The thickness of the entire flexible printed circuit board 2 including a plurality of conductor layers4 ranges from approximately several tens μm to several hundreds μm.

The semiconductor device 6 is electrically connected to the conductor layer 5 of the flexible printed circuit board 2 through bump electrodes 7. Bump electrodes 7 may be provided on the semiconductor device 6 side in advance or may be provided on the conductor layer 4 in advance.

The semiconductor device 6 mounted on the flexible printed circuit board 2 in such a manner as described above is encapsulated with encapsulating resin 8. For the encapsulating resin 8, a thermosetting resin such as an epoxy type resin or a silicone type resin is used. Further, an upper reinforcing plate 10 is provided on the encapsulating resin 8.

Such a structure wherein the upper reinforcing plate 10 is provided on the encapsulating resin 8 as described above can be obtained, for example, by arranging, before the semiconductor device 6 mounted on the flexible printed circuit board 2 is encapsulated with a resin, the upper reinforcing plate 10 in a spaced relationship above the semiconductor device 6, flowing a molten encapsulating resin between the flexible printed circuit board 2 and the upper reinforcing plate 10 and then hardening the resin. As a result of use of the encapsulating resin 8 to support the upper reinforcing plate 10, there is no necessity to provide an additional structure member for supporting the upper reinforcing plate 10 on the flexible printed circuit board 2. Consequently, the structure does not make the circuit board unit 1 unnecessarily large and is simple in construction.

Meanwhile, on the reverse side of the flexible printed circuit board 2 in a region in which the semiconductor device 6 is mounted, a reverse side reinforcing plate 9 made of a polyimide material or a glass epoxy material is provided. This reverse side reinforcing plate 9 is joined to the reverse side of the flexible printed circuit board 2 in advance before the semiconductor device 6 is mounted onto the flexible printed circuit board 2.

As described hereinabove, since the flexible printed circuit board 2 is as thin as several hundreds μm or less and besides is flexible, there arises a problem that mounting of the semiconductor device 6 or transportation of the flexible printed circuit board 2 is difficult in the assembling process of the circuit board unit 1. However, the principal reason for the use of the flexible printed circuit board 2 as a mounting board resides in its comparatively small thickness and its flexibility, and these properties cannot be degraded.

Thus, by employing the flexible printed circuit board 2 on which the reverse side reinforcing plate 9 is provided as in the present embodiment, while the flexible printed circuit board 2 has a flexibility as a whole, a rigidity can be provided to the portion of the flexible printed circuit board 2 at which the semiconductor device 6 is mounted.

In addition, because of the structure wherein the semiconductor device 6 is sandwiched between the upper reinforcing plate 10 and the reverse side reinforcing plate 9, the sufficient rigidity of the portion of the flexible printed circuit board 2 at which the semiconductor device 6 is mounted after assembly can be provided by the upper reinforcing plate 10 as well as the reverse side reinforcing plate 9. As a result of this, electrically connecting portions between encapsulated semiconductor device 6 and the flexible circuit board 2 are less likely to be subjected to external stresses, and therefore the reliability of the connection between the semiconductor device 6 and the flexible printed circuit board 2 after assembly is enhanced. Besides, since the upper reinforcing plate 10 together with the encapsulating resin 8 cover the entire semiconductor device 6, the protection of the semiconductor device 6 is improved.

When the semiconductor device 6 is connected by bump electrodes 7 as in the present embodiment, the reverse side reinforcing plate 9 having the thickness of approximately 0.2 to 0.5 mm exhibits a sufficient rigidity. However, the reverse side reinforcing plate 9 may have a greater thickness. It is noted that since the upper reinforcing plate 10 also serves to assure the rigidity of the portion of the flexible printed circuit board 2 at which the semiconductor device 6 is mounted after assembly, the thickness of the reverse side reinforcing plate 9 should be selected to obtain a sufficient rigidity in the mounting process of the semiconductor device 6.

Since the reverse side reinforcing plate 9 is required to provide the rigidity for the flexible printed circuit board 2 in the mounting process of the semiconductor device 6, the reverse side reinforcing plate 9 need not have an unnecessarily great thickness, and hence transportation of the flexible printed circuit board 2 in the assembling process is facilitated. Further, the reverse side reinforcing plate 9 suppresses warpage or deflection of the flexible printed circuit board 2 when the semiconductor device 6 is mounted. As a result, the flatness of the mounting portion of the flexible printed circuit board 2 for the semiconductor device 6 is maintained, thus establishing a reliable electric connection between the semiconductor device 6 and the flexible printed circuit board 2 is established with certainty. Particularly, when the semiconductor device 6 is mounted on the flexible printed circuit board 2 with bump electrodes 7 interposed therebetween as in the present embodiment, since a high positioning accuracy is required between the semiconductor device 6 and the flexible printed circuit board 2, the greater effect can be obtained. Even in this case, a reliable electric connection can be established between the semiconductor device 6 and the flexible printed circuit board 2.

In addition, if the reverse side reinforcing plate 9 is made of the same material as that of the base film 3 of the flexible printed circuit board 2, then the thermal expansions of the base film 3 and the reverse side reinforcing plate 9 due to heat applied during the mounting of the semiconductor device 6 will be made equal to each other. As a consequence, warpage or deflection of the flexible printed circuit board 2 during the mounting of the semiconductor device 6 is suppressed moer effectively and therefore better mounting can be achieved.

Meanwhile, is the upper reinforcing plate 10 is made of a metal, then the upper reinforcing plate 10 can be effectively radiated from heat generated by operation of the semiconductor device 6. Even if the upper reinforcing plate 10 is configured by a metal, the mounting step of the semiconductor device 6 is not affected since the upper reinforcing plate 10 is attached after the semiconductor device 6 is mounted.

The upper reinforcing plate 10 may function not only to provide rigidity to an amounting portion of the semiconductor device 6 so as to protect it but also to attach the circuit board unit 1 to another unit. For this purpose, the size and shape of the upper reinforcing plate 10 may be determined arbitrarily within a range in which the flexibility of any portion of the flexible printed circuit board 2 which dose not require a rigidity is not impaired and the entire the circuit board unit 1 dose not become unnecessarily large. For example, the upper reinforcing plate 10 may be stuck out from the flexible printed circuit board 2. In this instance, a threaded hole for securing the upper reinforcing plate 10 to other unit or a structure for coupling the upper reinforcing plate 10 to other unit may be provided in or on the stuck-out portion of the upper reinforcing plate 10.

As described above, the reverse side reinforcing plate 9 is configured taking into consideration the efficiency of the assembling process, and the upper reinforcing plate 10 is configured so as to provide the rigidity to the portion of the flexible printed circuit board 2 at which the semiconductor device 6 is mounted when the circuit board unit 1 is assembled. Therefore, the circuit board unit 1 with a predetermined function can be fabricated efficiently.

Second Embodiment

Figure 4:
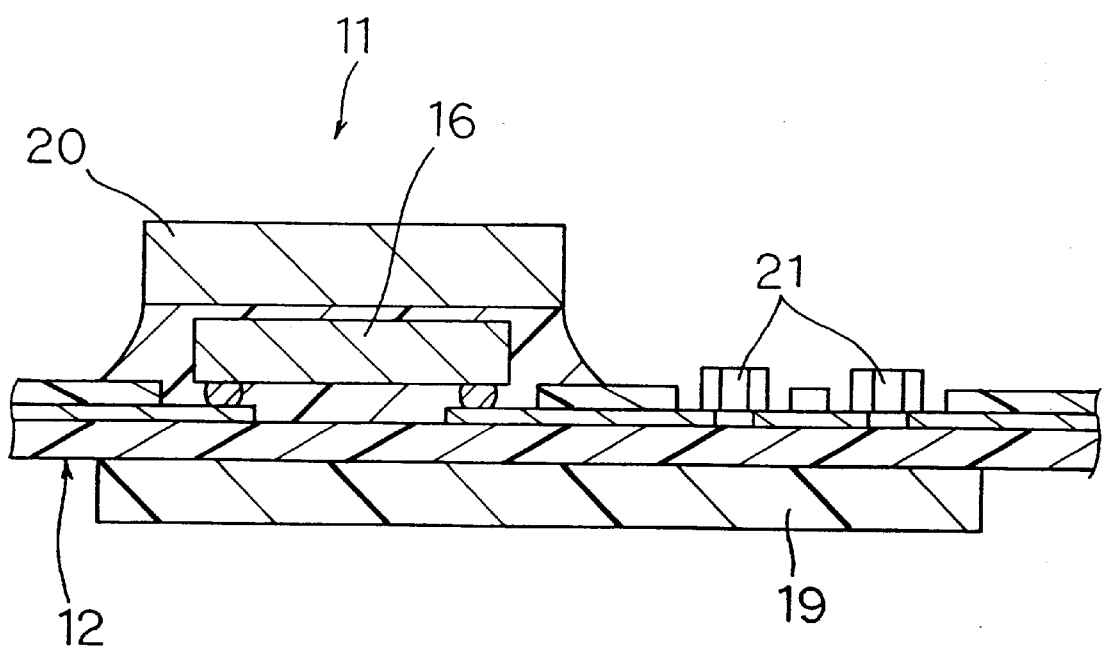
FIG. 4 is a sectional view of part of a flexible printed circuit board unit of a second embodiment of the present invention.

Referring mow to FIG. 4, there is shown a circuit board unit 11 according to the second embodiment of the present invention, wherein chip parts 21 such as chip capacitors or chip resistors are mounted on a flexible printed circuit board 12 in proximity to an area where a semiconductor device 16 is to be mounted. A reverse side reinforcing plate 19 is sized such that it covers not only the reverse side of the flexible printed circuit board 12 in the region in which the semiconductor device 16 is mounted, but also the reverse side of flexible printed circuit board 12 in another region in which the chip parts 21 are mounted. Since the construction of the remaining part of the present embodiment is similar to that of the first embodiment, overlapping description of the same is omitted.

With an circuit board unit in actual use, the flexibility is sometimes required in a small area of the flexible printed circuit board 12. In such an instance, the reverse side reinforcing plate 19 may be dimensioned as large as possible at a region of the flexible printed circuit board 12 that do not require flexibility thereby facilitating the transportation of the flexible printed circuit board 12 in the assembling process of the circuit board unit 11. Also the size of an upper reinforcing plate 20 may also be varied within a practical range similarly to that of the reverse side reinforcing plate 19.

Third Embodiment

Figure 5:
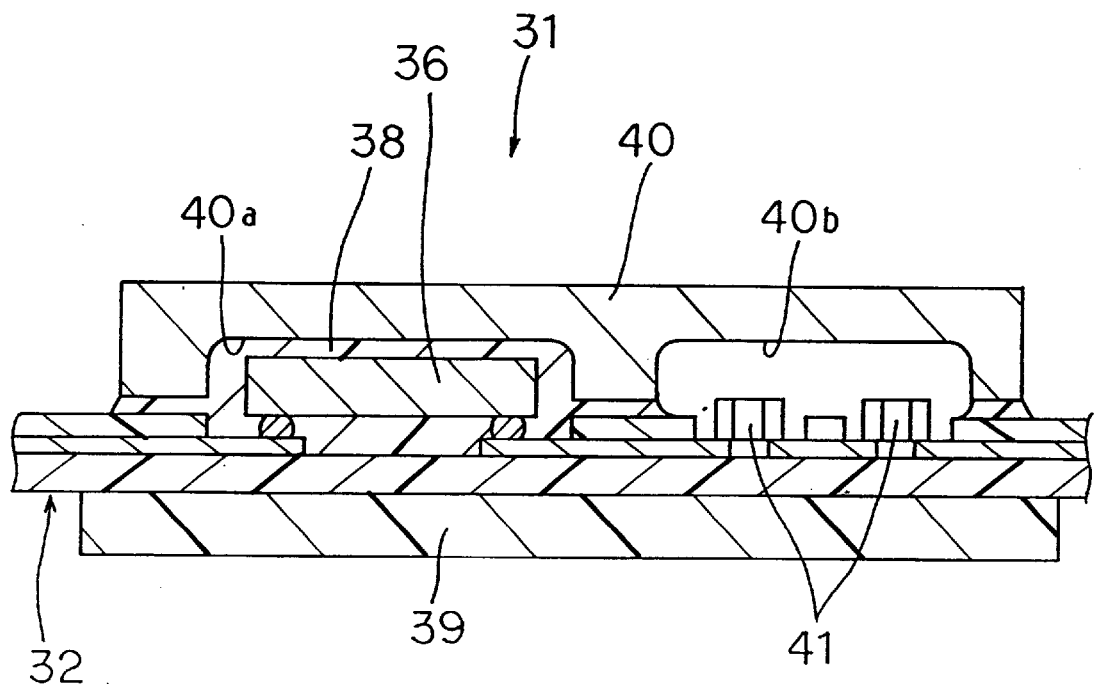
FIG. 5 is a sectional view of part of a flexible printed circuit board unit of a third embodiment of the present invention.

Referring now to FIG. 5, there is shown a circuit board unit 31 according to the third embodiment of the present invention. The present embodiment is an application of the second embodiment and is different in shape of an upper reinforcing plate 40 from that in the second embodiment. The construction of the remaining part of the present embodiment is similar to that of the second embodiment.

The upper reinforcing plate 40 has a size sufficient to cover not only a semiconductor device 36 but also chip parts 41 and is securely mounted on a flexible printed circuit board 32 by encapsulating resin 38. The upper reinforcing plate 40 has recesses 40a, 40b formed on a surface thereof opposing to the flexible printed circuit board 32 for accommodating the semiconductor device 36 and the chip parts 41, respectively. The semiconductor device 36 and the chip parts 41 are positioned within the recesses 40a, 40b, respectively. The upper reinforcing plate 40 is made of an aluminum alloy in consideration for a heat radiating efficiency. The overall thickness of the upper reinforcing plate 40 is approximately 1 to 3 mm and the depths of the recesses 40a, 40b are approximately 0.5 to 2 mm.

The encapsulating resin 38 is filled into the inside of the recess 40a which covers the semiconductor device 36 and is applied to a bonding surface of the upper reinforcing plate 40 to the flexible printed circuit board 32. Thereafter the encapsulating resin 38 is hardened. Consequently, the upper reinforcing plate 40 encapsulates and protects the semiconductor device 36 and the chip parts 41. It is noted that, for example, the reverse side reinforcing plate 39 may be made of polyimide plate 0.2 mm thick.

As described above, by covering the entirety of the semiconductor device 36 and the chip parts 41 with the upper reinforcing plate 40, the electric parts which are mounted on the flexible printed circuit board 32 can be protected certainly.

Fourth Embodiment

Figure 6:
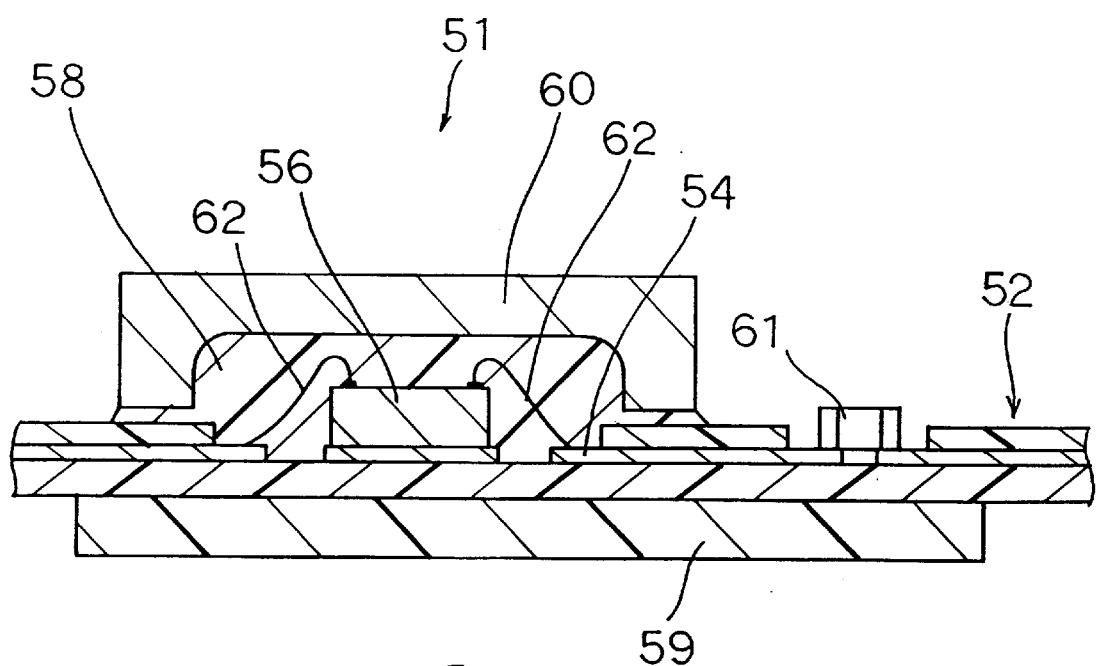
FIG. 6 is a sectional view of part of a flexible printed circuit board unit of a fourth embodiment of the present invention.

Referring now to FIG. 6, there is shown a circuit board unit 51 according to the fourth embodiment of the present invention.

In the first to third embodiments described above, a semiconductor device is mounted on a flexible printed circuit board with bump electrodes interposed therebetween. In the circuit board unit 51, a semiconductor device 56 is electrically connected to a conductor layer 54 of a flexible printed circuit board 52 by bonding wires 62.

A reverse side reinforcing plate 59 is provided on a reverse side of the flexible printed circuit board 52 in a region in which the semiconductor device 56 is mounted and another region in which a chip part 61 is mounted similarly as in the second embodiment and the third embodiment. An upper reinforcing plate 60 is a cap-shaped member similar to that in the third embodiment and is securely mounted on the flexible printed circuit board 52 by encapsulating resin 58. In the present embodiment, however, the upper reinforcing plate 60 does not cover the chip part 61 but covers only the semiconductor device 56. In case of the chip part 61 need not be protected particularly by the upper reinforcing plate 60 and a sufficient rigidity in the region of the flexible printed circuit board 52 in which the chip part 61 is mounted can be assured only by the reverse side reinforcing plate 59, the upper reinforcing plate 60 may be shaped so as not to cover the chip part 61.

In addition, in case of the bonding wires 62 are used for connection the semiconductor device 56 and the flexible printed circuit board 52, the depth of the recess of the upper reinforcing plate 60 must be designed with the height of the bonding wires 62 taken into consideration in addition to the thickness of the semiconductor device 56. Since the thickness of the semiconductor device 56 normally is 0.2 to 0.5 mm, the depth of the recess is made greater by approximately 0.3 to 0.5 mm than the thickness of the semiconductor device 56 with the height of the bonding wires 62 and a suitable margin taken into consideration. In case of bump electrodes are used for connection the semiconductor device 56 and the flexible printed circuit board 52, the depth of the recess should be made greater by approximately 0.1 mm than the thickness of the semiconductor device 56.

While preferred embodiments of the present invention have been described using specific terms, such description is for illustrative purposes only, and it is to be understood that changes and variations may be made without departing from the spirit or scope of the following claims.

What is claimed is:

1. A flexible printed circuit board unit, comprising:

a flexible printed circuit board;

one or more electronic parts encapsulated in encapsulating resin and electrically connected to and mounted on a front surface of said flexible printed circuit board;

a reverse side reinforcing plate provided on a reverse side of said flexible printed circuit board in a region in which said electronic parts are mounted; and an upper reinforcing structure comprising a reinforcing plate provided on a front surface of said flexible printed circuit board and mounted on said encapsulating resin so as to cover at least one of said electronic parts.

2. The flexible printed circuit board unit as claimed in claim 1, wherein said flexible printed circuit board includes a base film made of an organic material, and a conductor layer formed on said base film and electrically connected to said electronic parts.

3. The flexible printed circuit board unit as claimed in claim 2, wherein the material of said reverse side reinforcing plate is the same as that of said base film.

4. The flexible printed circuit board unit as claimed in claim 1, wherein at least one of said electronic parts are semiconductor devices.

5. The flexible printed circuit board unit as claimed in claim 4, wherein said upper reinforcing plate has a recess formed therein for accommodating said semiconductor devices, and is securely mounted on said flexible printed circuit board with said encapsulating resin in a condition wherein said semiconductor devices are positioned in said recess.

6. The flexible printed circuit board unit as claimed in claim 4, wherein said upper reinforcing plate is made of a metal.

* * * * *